United States Patent
Wang et al.

(10) Patent No.: US 6,534,250 B1
(45) Date of Patent: Mar. 18, 2003

(54) PHOTO-REACTIVE BENZOCYCLOBUTENONES AND POLYMERS THEREFORM FOR SELF-PHOTOCURING, PHOTO-CROSSLINKING AND PHOTOPATTERNING WITHOUT CATALYSTS

(75) Inventors: Zhi Yuan Wang, Ottawa (CA); Li Kuang, Ottawa (CA); Jian Ping Gao, Ottawa (CA)

(73) Assignee: Carleton University, Ottawa (CA)

( * ) Notice: Subject to any disclaimer, the term of this patent is extended or adjusted under 35 U.S.C. 154(b) by 0 days.

(21) Appl. No.: 09/847,339

(22) Filed: May 3, 2001

Related U.S. Application Data

(60) Provisional application No. 60/201,731, filed on May 4, 2000.

(51) Int. Cl.[7] .................................................. G03C 1/08
(52) U.S. Cl. .................... 430/325; 526/279; 526/328.5; 526/307.4; 526/342; 526/347; 528/310; 567/306; 567/348; 567/331; 564/48

(58) Field of Search ............................... 526/279, 328.5, 526/307.4, 342, 347, 348; 528/310; 430/325; 568/306, 331; 564/48

(56) References Cited

U.S. PATENT DOCUMENTS 5,869,693 A * 2/1999 Wang

OTHER PUBLICATIONS

Wang et al., Macromolecules (1998) 31(16), 5556–5558.*

* cited by examiner

Primary Examiner—Robert Dawson
Assistant Examiner—Kuo-Liang Peng
(74) Attorney, Agent, or Firm—Ogilvy Renault

(57) ABSTRACT

Functionalized derivatives of benzocyclobutenone of formula I and II herein are photoreactive and may be employed in the production of a variety of self-curable polymer composition which may be employed as photoresist compositions, pressure sensitive adhesives, hot melt adhesives and sealants; the polymer compositions may be cured or cross-linked by UV or Vis radiations.

7 Claims, No Drawings

PHOTO-REACTIVE BENZOCYCLOBUTENONES AND POLYMERS THEREFROM FOR SELF-PHOTOCURING, PHOTO-CROSSLINKING AND PHOTOPATTERNING WITHOUT CATALYSTS

CROSS REFERENCE TO RELATED APPLICATION

This Application is related to U.S. application Ser. No. 60/201,731, filed May 4, 2000, and the benefit under 35 USC 119(e) of such U.S. Application is claimed.

BACKGROUND OF THE INVENTION

With the increasing growth of semiconductor and microelectronic technology, optical materials have attracted considerable attention since they can meet the demanding performance requirements for telecommunication, data communication and information storage systems.[1,2] One of the most interesting and useful classes of optical materials is photo-reactive polymers, which undergo photo-transformation under direct ultraviolet (UV) or visible (Vis) light irradiation. Recently, the synthesis of photo-reactive polymers has developed to a widespread research area, due to their applications in photoresists,[3] microlithography,[4] holographic data storage,[5] and as photocurable adhesives in optical interconnections.[6]

There are several curable molecular and polymeric systems currently available, these systems usually contain reactive acetylene, epoxide/amine or anhydride groups, as curing agents, and benzocyclobutene (BCB). The problems or weaknesses associated with these curing systems are: high curing temperature is required; environmentally harmful gases are released during the curing procedure; large amounts thereof are required, thereby increasing the production cost and causing voids in molded articles; the area of application is confined due to the lack of interpolymer coupling reactions and only based on dimerization and Diels-Alder cycloaddition reactions with respect to the BCB chemistry. Above all, these curing systems are not best suited to the UV curing process, as they require the use of photoinitiators and photochemically generated acid or base catalysts.

The chemistry of most photo-reactive polymers used in photoresists is based on the incorporation of a functionally photosensitive moiety, for instance, carbon-carbon double bond,[6] epoxide,[6] Novolak/diazoquinone[4b] or photo-generated acid group[4b]. These systems need a photoinitiator, photosensitizer, or a photoacid generator to carry out the photoreactions. If a direct photocurable system consisting of a photo-reactive latent group were available, the cure formulation would be simpler and stable without at least a photoacid/base generator and the cost of fabrication process would be reduced. The incorporation of a latent photo-reactive group into a polymer allows the structural control and tailoring of inherent properties of the polymer.

Benzocyclobutenone (BCBO), that can be easily prepared in large quantities from anthranilic acid, homophthalic anhydride, or o-toluoyl chloride according to known methods[7], has been reported to undergo electrocyclic ring-opening upon thermolysis[8,9] or photolysis[8,10] to give a reactive ketene, α-oxo-o-quinodimethane. Besides the facile thermal[4+2] cycloaddition reaction with dienophiles such as carbonyls,[11] and [60]fullerene[12], it has been demonstrated that the thermally-generated ketene (at 150° C.) also undergoes a coupling reaction with a variety of alcohols to form esters in high yields[13]. An earlier patent (Z. Y. Wang, U.S. Pat. No. 5,869,693) teaches the preparation of a variety of functionalized benzocyclobutenones, particularly 5-aminobenzocyclobutenone, and the polymers derived therefrom. Further, it teaches thermally induced crosslinking and curing with the functionalized benzocyclobutenones.

If the reaction of BCBO with itself or alcohol could also be done under UV irradiation at ambient temperature, BCBO could thus be considered as a latent photo-reactive group, and used as a curing agent for UV-Vis curing of polymers.

There is a need for a UV curing agent that is latent reactive or thermally stable at ambient temperatures and up to 250° C.

There is a need for having such a UV-Vis curing agent that can be easily functionalized and incorporated into a wide spectrum of polymers that are either known and in commercial production or disclosed in the literature.

There is a need for having such a UV-Vis curing agent that survives the polymerization conditions and remains inactive until being triggered by UV-Vis irradiation at ambient temperatures. There is a need for a UV-Vis curing process during which no volatile small molecules are generated.

There is a need for a new type of photo-reactive polymer capable of undergoing grafting and crosslinking by simple UV-Vis irradiation, without using any catalysts or photosensitizers. There is a need for a new type of photo-reactive polymer capable of providing a fine pattern in a submicron to centimeter resolution on different substrates, by simple UV-Vis curing processes without using any catalysts raid or photosensitizers.

SUMMARY OF THE INVENTION

The present invention relates broadly to a series of functionalized photo-reactive benzocyclobutenones that can be used for photochemically crosslinking a variety of hydroxy- or amino-containing polymers.

This invention also relates to a series of polymer compositions that undergo grafting or crosslinking by UV-Vis irradiation to produce polymeric products having an improved balance of properties, and which can be used for surface modification and photochemically forming patterned coatings on substrates.

In particular, the present invention discloses the functionalization of BCBO, the incorporation of BCBO as a latent UV curing agent in a wide spectrum of addition and condensation polymers, and the UV curing procedures and applications thereof of said polymers in surface modification and photopatterning according to their the photo grafting and photo crosslinking reactions.

In accordance with the invention there is provided BCBO derivatives represented by the formulae (I) and (II):

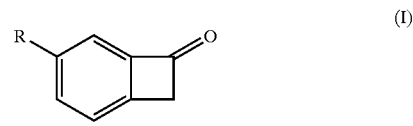

-continued

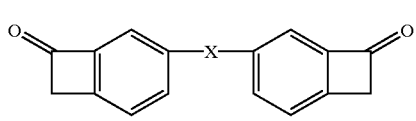
(II)

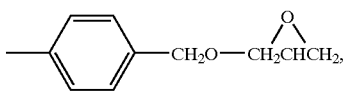

or —COOR₂, where R₂ is H, alkyl or haloalkyl, wherein R is —SH, —SO₂Cl, —SO₃H, N-substituted group or other electron-withdrawing or electron-donating groups; wherein X is a polyvalent organic bridging group.

In accordance with another aspect of the invention there is provided BCBO-containing copolymers represented by the formulae III–VI:

hydroxyalkyl, cyanoalkyl, epoxyalkyl, alkoxy, ether, ester or acetate; and $R_1$ is H or a methyl group.

In still another aspect of the invention there is provided BCBO-containing terpolymers represented by the formulae VII–X:

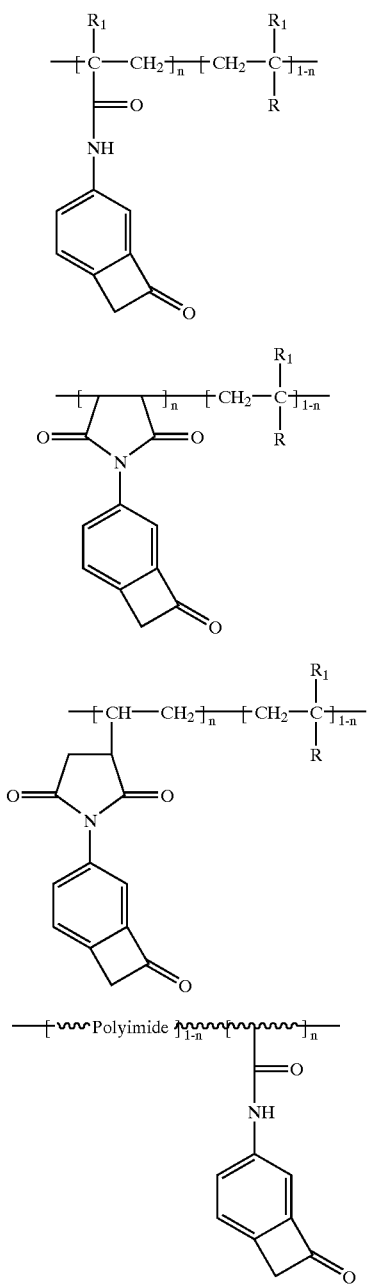

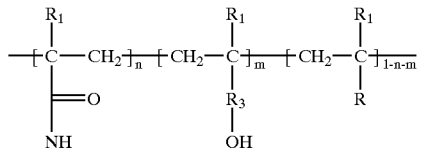
(VII)

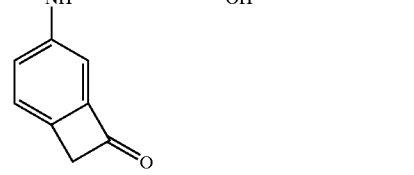
(VIII)

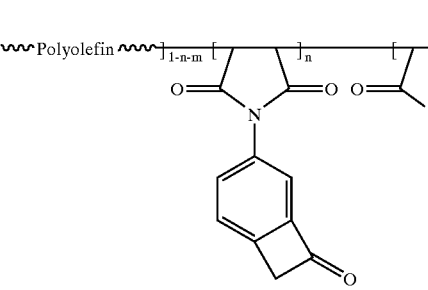
(IX)

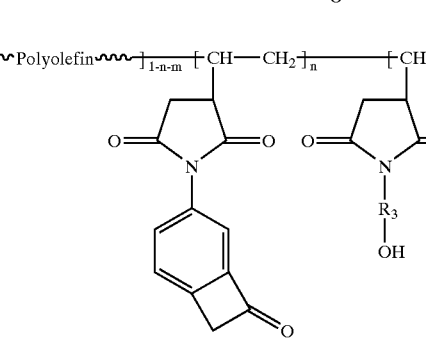
(X)

wherein R is alkyl, aryl, haloalkyl, hydroxyalkyl, —CN, —CONH₂, —Si(OCH₃)₃, wherein R is alkyl, aryl, haloalkyl, hydroxyalkyl, —CN, —CONH₂, —Si(OCH₃)₃,

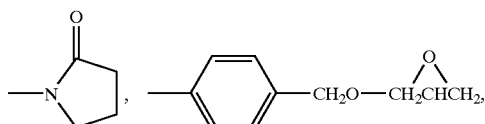

or ―COOR₂, where R₂ is H, alkyl or haloalkyl, hydroxyalkyl, cyanoalkyl, epoxyalkyl, alkoxy, ether, ester, acetate; $R_1$ is H or methyl group; $R_3$ is alkyl, aryl, or an ester moiety.

The alkyl radicals and moieties in the aforementioned definitions of R typically have 1 to 10, preferably 1 to 6, more preferably 1 to 4 carbon atoms.

The aryl radical in the aforementioned definitions of R typically has 6 to 10 carbon atoms, for example phenyl or naphthyl, and may be unsubstituted or substituted; typical substituents are one or more of alkyl, alkoxy and halogen, in which the alkyl and alkoxy have 1 to 10, preferably 1 to 6, more preferably 1 to 4 carbon atoms; and the halogen is fluorine, chlorine, bromine or iodine.

The values n and m in the above formulae identify the number of repeat units, each of n and m being in the range of 0.1 to 0.9. The designation ⁓⁓⁓⁓⁓⁓ as in [⁓⁓⁓⁓⁓⁓] is convention for identifying a polymer backbone to which the pendant groups shown in the formulae are attached.

In general the copolymers and terpolymers of formula (III) to (X) have a weight average molecular weight of 3,000 to 100,000, preferably 3,000 to 60,000, more preferably 5,000 to 30,000.

In formula (III) n is less than 1; and in formula (VII) m/n and m+n should both be less than 1.

DETAILED DESCRIPTION OF THE INVENTION

The present invention provides generally a new type of photo-crosslinker and photo-reactive polymers capable of undergoing grafting and crosslinking upon UV-Vis irradiation, without using any catalysts or photosensitizers. Specifically, the photochemistry based on the reaction of benzocyclobutenone with itself and alcohol is exploited, and the use of benzocyclobutenone as a latent reactive group in various polymers is developed therefrom.

Benzocyclobutenone is easily functionalized to give a series of benzocyclobutenone derivatives of formula (I)L

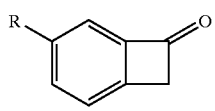

wherein R is any electron-withdrawing and electron-donating group. Preferably, R is —SH, —SO₂Cl, —SO₃H, or N-substituted group, for example:

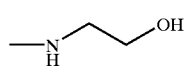
I-1

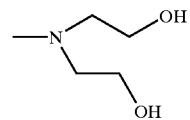
I-2

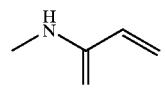
I-3

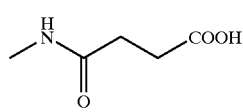
I-4

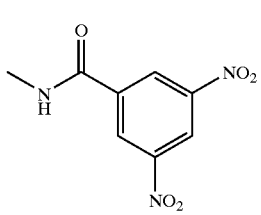
I-5

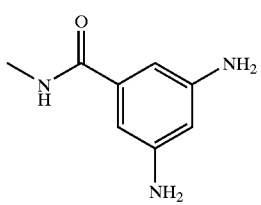
I-6

―SO₂Cl
I-7

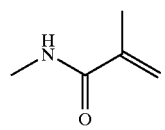
I-8

The preparation of the functionalized BCBO derivatives (I-1 to I-6) uses 5-aminobenzocyclobutenone (U.S. Pat. No. 5,869,693). The functionalization is typically a reaction of 5-aminobenzocyclobutenone with 2-bromoethanol, acryloyl chloride, methacryloyl chloride, succinic anhydride or 3,5-dinitrobenzoyl chloride. Furthermore, direct chlorosulfonation of benzocyclobutenone affords 5-chlorosulfonyl benzocyclobutenone (I-7), which can be hydrolyzed to the corresponding sulfonic acid and reduced to the thiol. Compounds I-1 and I-2 undergo polymerization and crosslinking reaction in solution or in the solid state, as illustrated in Example 1, however useful polymerization and crosslinking reactions are not limited to those illustrated in Example 1, to yield polymeric resins upon photo irradiation at ambient temperatures. Compound I-3 is an acrylamide monomer, which is used to copolymerize with a variety of commercially available vinyl monomers to yield the corresponding photo-reactive vinyl polymers. Diamine I-6 is used to form a photo-reactive polyimide in the polycondensation of a diamine and a dianhydride. Both compounds I-4 and I-7 can be used to react with either the hydroxy or amino groups presented in a polymer, such as poly(4-hydroxy styrene), polyvinyl alcohol and polybutyral. Thus, the resulting grafted polymers contain a reactive BCBO group and can be photochemically crosslinked.

The BCBO derivatives can also be taken in the following formula II:

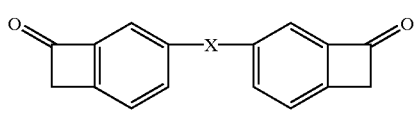

(II)

wherein X is a polyvalent organic bridging group. Preferably, X is a divalent moiety selected from the group consisting of:

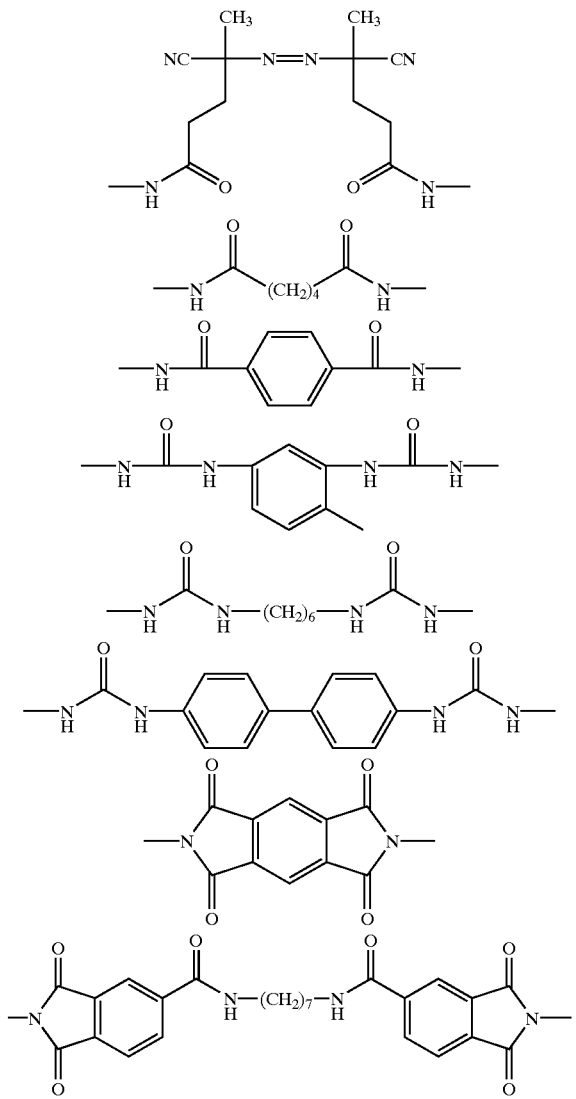

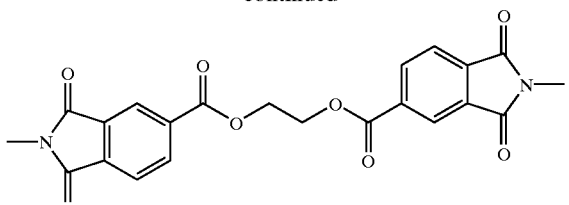

The above bis-BCBO derivatives are generally prepared by reacting 5-aminobenzocyclobutenone with the corresponding diacid chloride, diisocyanate or dianhydride in solution, as described in U.S. Pat. No. 5,869,693. These bis-BCBO compounds are generally solids with high melting points and possess high thermal stability. Typically, the thermal ring-opening temperatures are over 200° C. Thus, they can be used in melt mixing (e.g., melt extrusion or compression) with any hydroxy-containing polymers such as polyol, poly(vinyl alcohol) or polybutyral and presented in photocopy toner and as polymers for use as a pressure-sensitive adhesive that contains a small amount of the hydroxy functionality. These bis-BCBO compounds are typically photo crosslinkers for curing the above hydroxy-containing polymers, as illustrated in example 20.

Using BCBO-containing vinyl monomers such as I-3 or 5-aminobenzocyclobutenone, BCBO can thus be incorporated into a wide spectrum of vinyl polymers as a pendent group through copolymerization with vinyl monomers or through grafting onto anhydride-containing and carboxylic acid-containing polymers via imidization transformation and acid-amine coupling reactions. Thus, the BCBO-containing copolymers include those of the formulae III–VI above. For example, I-3 monomer can copolymerize with any commercial vinyl monomers such as styrene using AIBN (Azobisisobutyronitrile) as a radical initiator in solution. Furthermore, 5-aminobenzocyclobutenone may be grafted onto any maleic anhydride, or carboxyl acid containing commercial polymers. In addition, BCBO-containing polyimides or polyamides (or nylons) can also be prepared by the condensation of a diamine derived from BCBO such as I-6 with other dianhydrides and diacids or diacid chlorides, respectively. Preferably, the following BCBO-containing copolymers are prepared:

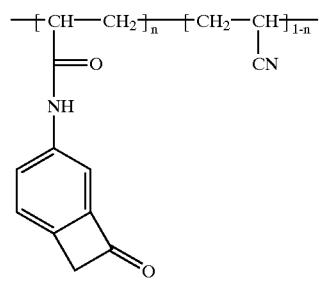

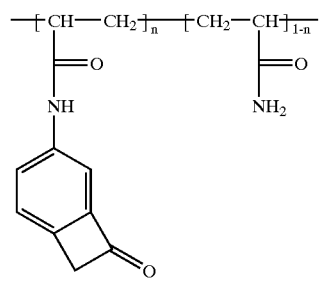

-continued
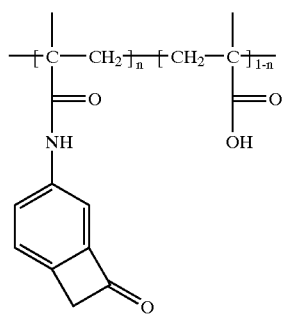
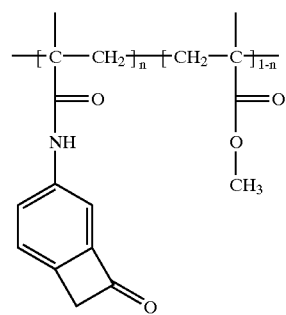
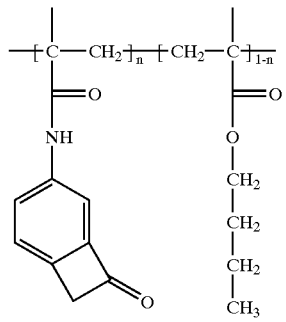
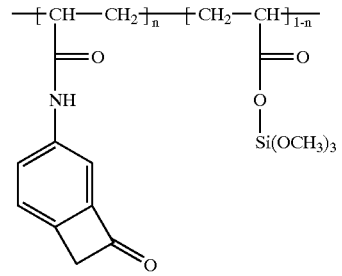
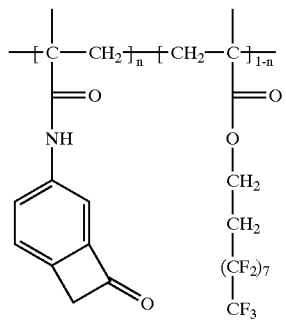
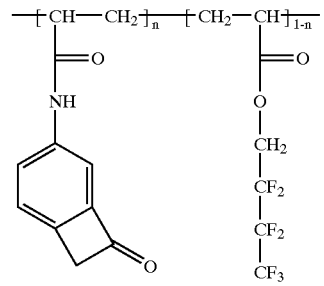
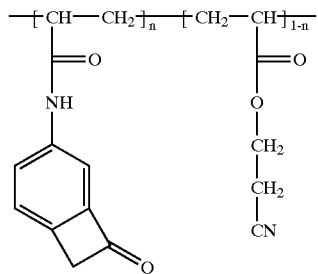
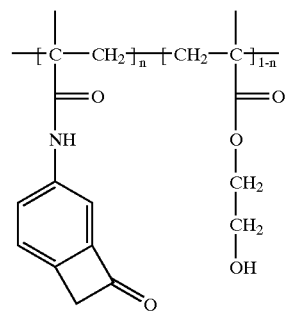
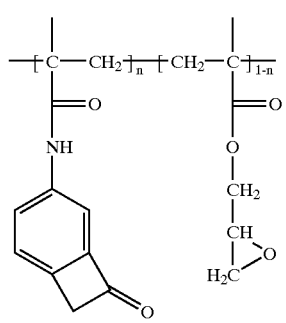
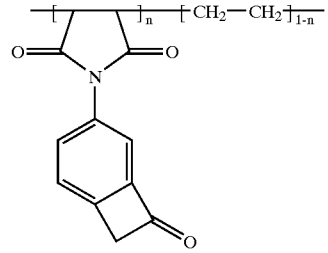

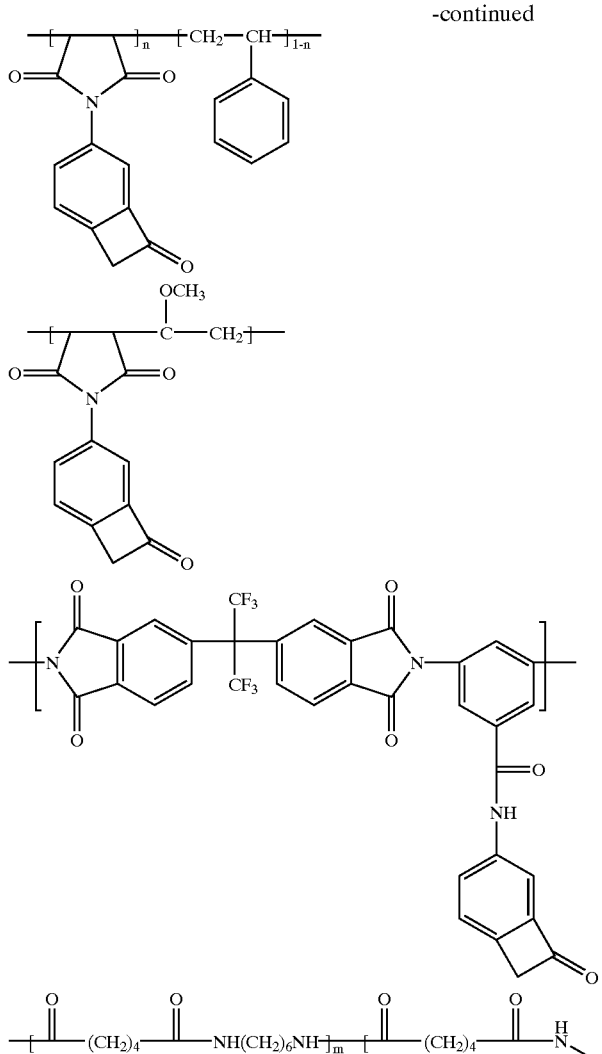
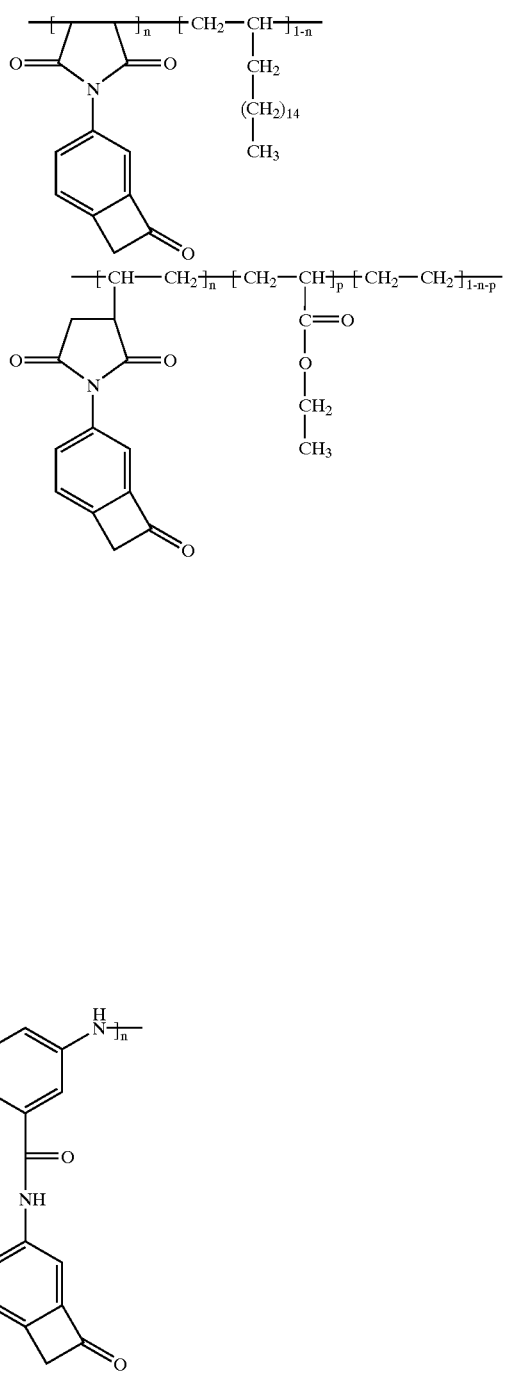

The copolymers containing the BCBO moiety can be modified in bulk and at the surface through the photografting reaction of BCBO with small hydroxyl-containing molecules, oligomers and polymers. The BCBO photochemistry provides ways and means for tailoring and enhancing the bulk and/or the surface properties of existing polymers through grafting. The amount of the grafted component such as a polyol can be controlled by the BCBO content in the polymers. The BCBO content in the polymers is typically in the range of 0.5 mol % to 80 mol % and preferably about 5 mol %. Hydrophilic, hydrophobic, and other functional units with a hydroxyl end group can be linked onto the BCBO-modified commercial polymers simply upon UV irradiation.

The hydroxyl-containing functional groups, preferably, are hydrophilic poly(ethylene glycol) methyl ether (any molecular weight, more preferably, low molecular weight between 550–2000), hydrophobic Zonyl® fluoroalcohol, fluorescent pyrenebutanol, azo dye Disperse Red-1, electrochromic hydroxyl-end capped naphthalene imide, and conductive hydroxyl-end capped materials. By using functional hydroxyl-containing molecules, the bulk or surface of the polymers can be selectively modified to have desirable properties attributed to the functional hydroxyl groups that are grafted on. With respect to surface grafting, the UV curing can happen selectively on the selected area of the substrate, since the location of photo grafting can be chosen through a photomask or shadow mask, as illustrated in Example 13. The substrate can be any polymer films, either hydrophilic or hydrophobic.

Using BCBO derivatives such as I-3 and I-8, the terpolymers containing both BCBO and hydroxyl groups having the structural formulae VII–X are prepared. Preferably, BCBO and OH-containing terpolymers or precursors of such terpolymers include the following, having the repeat units n and m in a range of 0.1 to 0.9:

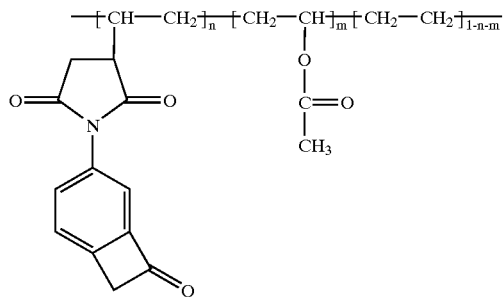

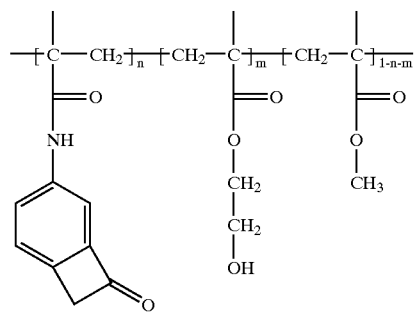

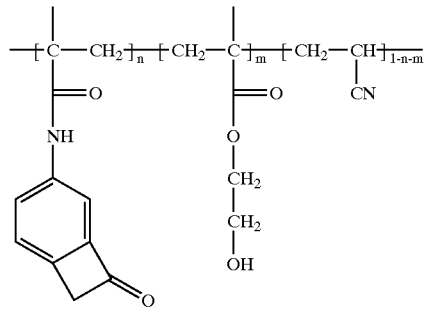

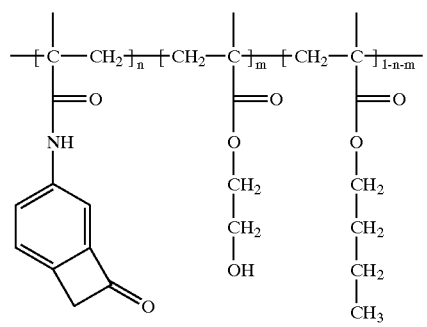

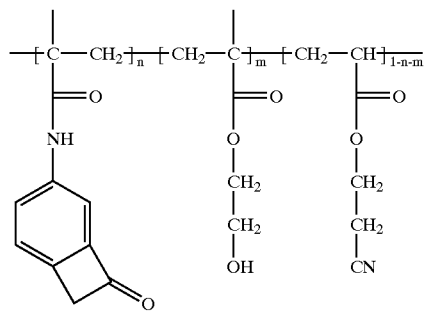

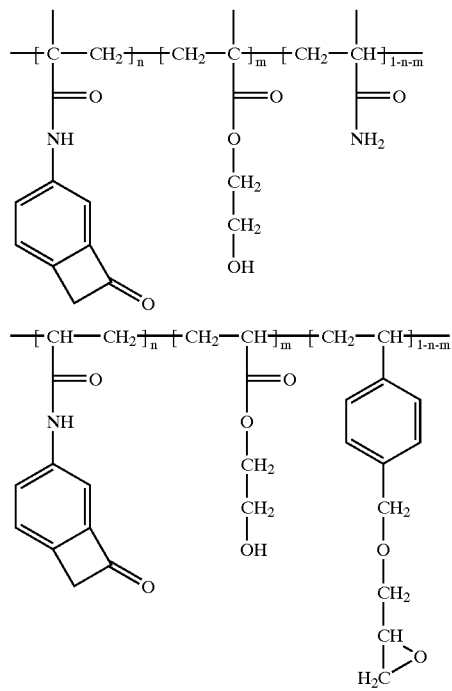

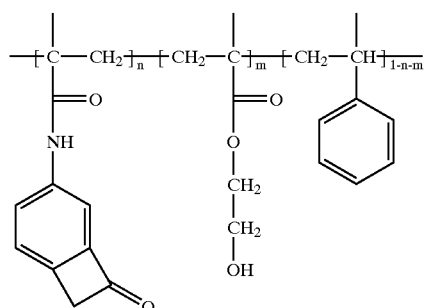

-continued
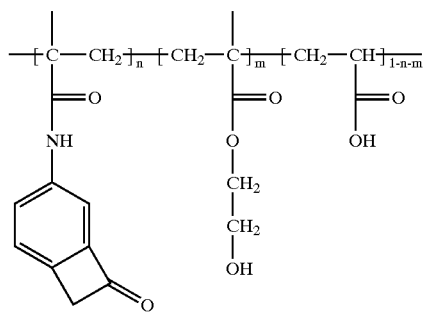
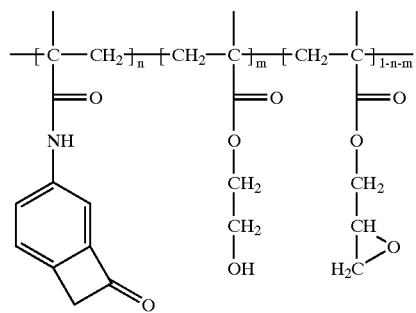
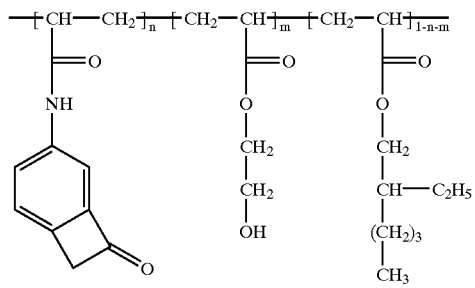
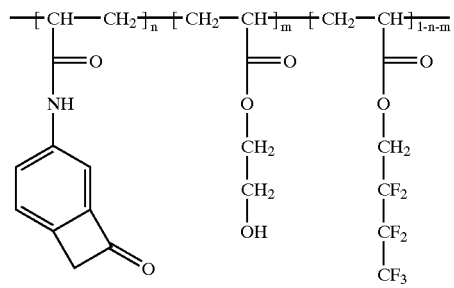
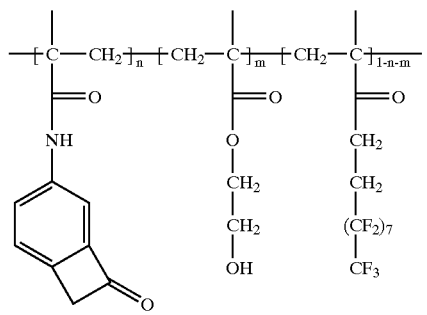
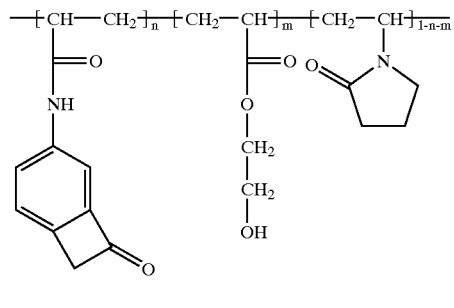
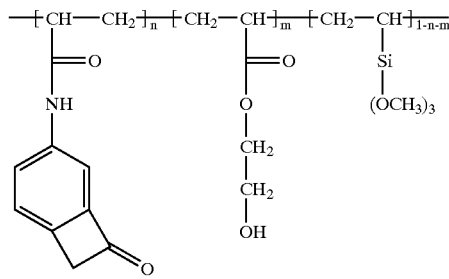
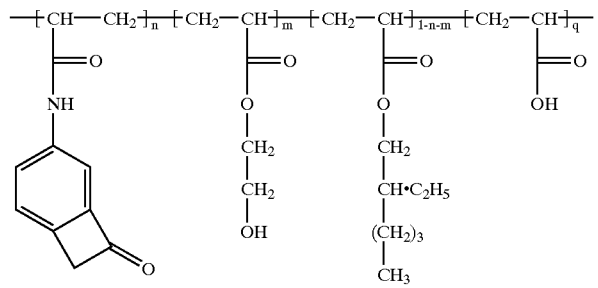
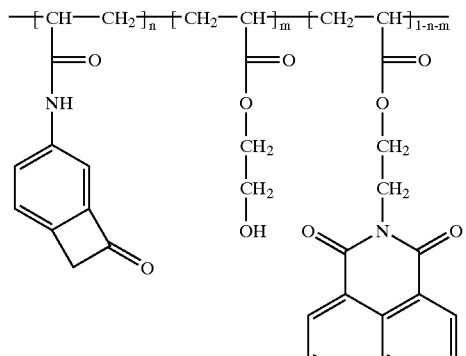
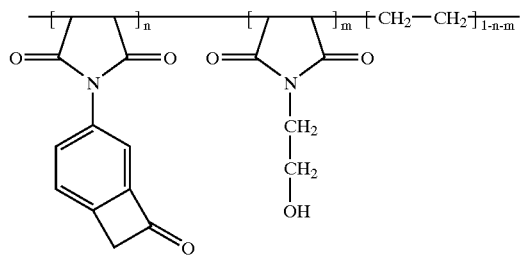

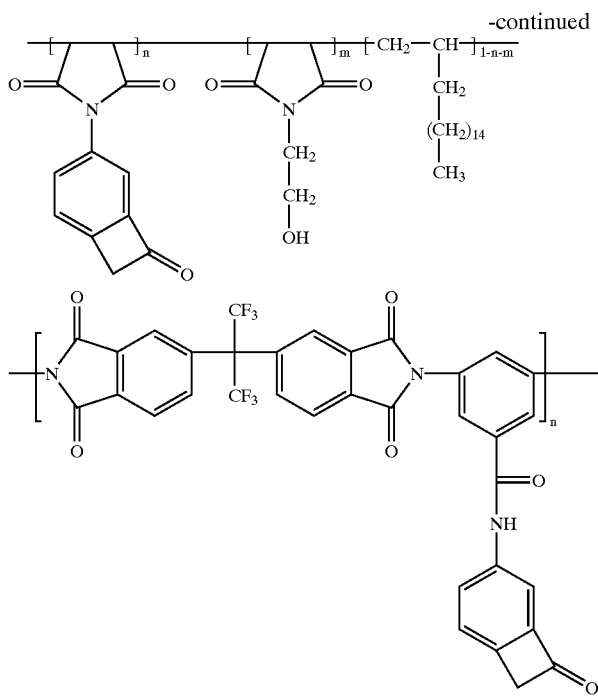
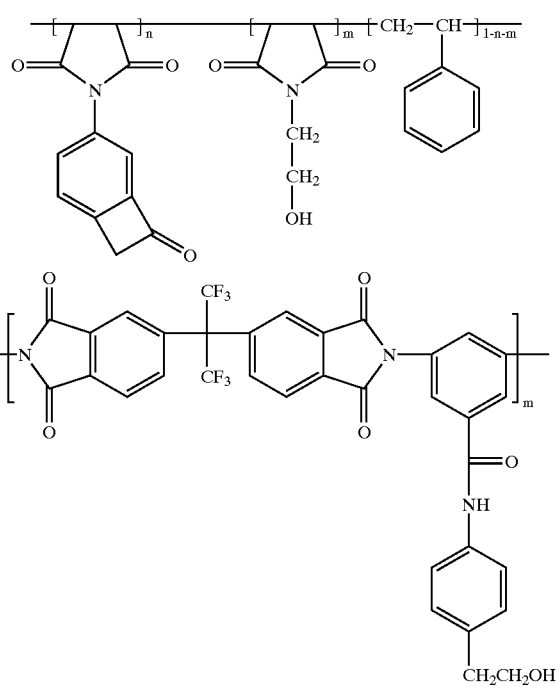

For crosslinking in solution, the solvent used to dissolve the BCBO polymers can be any organic solvent except an alcohol and preferably is selected from tetrahydrofuiran, ethyl acetate, ether, dichloromethane, chloroform, 1,1,2,2-tetrachloroethane, N,N-dimethylformamide, hydrocarbons, toluene and xylenes. The polymer concentration can be very dilute (0.5%) to very concentrated (50%).

With respect to curing in the solid state, the size and thickness of polymer films can be made according to requirements, coating conditions, and UV source available. Preferably, the UV curing area can be between 0.1 mm$^2$ to 15 cm$^2$, the film thickness can be from 50 nanometers to 2 mm.

The UV curing temperature can be as low as 77° K., and as high as 250° C. (or just below the thermal ring opening temperature of the BCBO group in the said polymer). Preferably, the UV curing proceeds at ambient temperatures. The wavelength of the light source varies between 250 nm to 500 nm, depending on the chemical structure of BCBO derivatives. Preferably, a wavelength of 300 nm to 350 nm is selected. The UV curing time can be less than a second to a few hours, depending on the film thickness, light intensity and light dose.

As shown in Example 9, photo coupling reactions of benzocyclobutenone with a variety of alcohols gives the corresponding esters in almost 100% yield. Kinetic studies indicate that the photo reaction of BCBO follows the first order kinetic. Thus, the ring-opening of BCBO in the photo coupling reaction with alcohol is the rate-determining step. The same is true in the self dimerization or crosslinking reaction of BCBO in a polymer.

The self-curable polymers, which contain the BCBO group or contain both BCBO and hydroxyl groups, can form crosslinked structures upon UV irradiation in solution or in the solid state. The crosslinking degree is controlled by the BCBO content in the polymers. The BCBO content in the self-curable polymers is in the range of 0.5 mol % to 80 mol %, preferably, 5 mol %. The ratio of BCBO to hydroxyl moiety can be from 0.5:1 to 1:10. Preferably, the ratio is 1:1 to 1:3. The aforementioned UV curing conditions can also be applied here.

A polymer gel can be obtained from a solution of self-curable vinyl polymers, polyolefins, polyamides, and polyimides upon irradiation, indicating that these polymers can be used as photoresists to directly form patterns on the substrate. The substrate can be glass, silicon wafer, metal, mica, wood, ceramics or polymers. Preferably, the substrate is glass, polymer, mica or silicon wafer. The function of the self-curable BCBO polymers can be passive and active, preferably, conductive, electrochromic, photochromic, photovoltaic, non-linear optical or magnetic. Thus, the self-UV curable BCBO-containing polymers are very useful in microlithography, because of the fast and neat curing process, furthermore, there is no need for any photoinitiator, photo acid generator as currently used.

The self-UV curable BCBO-containing polymers can also form a new type of UV adhesive, as illustrated in Example 7, however formation of UV adhesives is not limited to Example 7. The BCBO content in the polymers is in the range of 0.5 mol % to 80 mol %, preferably, 1–5 mol %. The ratio of BCBO to hydroxyl moiety can be from 0.5:1 to 1:10. Preferably, the ratio is 1:1 to 1:3. The aforementioned UV curing conditions can also be applied here. The shear modulus of the polymer containing only 5 mol % of BCBO was determined and significantly enhanced after UV curing.

The self-curable BCBO-containing polymers and oligomers, as described and demonstrated in Examples 1, 6, 7, 10, 12 and 16, can be potentially used as adhesives and sealants for microelectronics packaging and interconnection of optical fibers.

EXAMPLES

The following examples are included for illustrative purposes only, and do not limit the scope of the invention or the claims. Unless otherwise specified, all parts and percentages are by weight.

Example 1

Preparation of N-(1-Hydroxyethyl)-5-aminobenzocyclobutenone and N,N-bis(1-Hydroxyethyl)-5-aminobenzocyclobutenone (I-1 and I-2)

To a solution of 5-aminobenzocyclobutenone (1.33 g, 0.01 mol) and diazabicyclo[2,2,2] octane (2.098 g, 0.019 mol) in THF under nitrogen flow, was added excess of 2-bromoethanol (3.23 g, 0.026 mol) drop by drop. The reaction mixture was refluxing for about 24 hours. After the brown salt was removed by filtration, the filtrate was extracted with water several times. By chromatography using a mixture of hexane and ethyl acetate as the eluting solvent, the two products were isolated as identified by IR (3383 $cm^{-1}$, and 1750 $cm^{-1}$) and MS spectra.

Example 2

Preparation of 5-Chlorosulfonylbenzocyclobutenone (I-7)

Benzocyclobutenone (2.36 g, 0.02mol) was added slowly to a strongly stirred chlorosulfuric acid (3 mL) in chloroform (10 mL) solution. After the addition was done, the reaction mixture was stirred for 5 hours. Then the chloroform was evaporated, and the residue was precipitated in water yielding fine pink crystals. m.p. 80° C.; IR (KBr, $cm^{-1}$): 1762; UV ($\lambda_{max}$, methanol) 272 nm.

Example 3

Preparation of N-(3,5-Diaminobenzoyl)-5-aminobenzocyclobutenone (I-6)

To a solution of 5-aminobenzocyclobutenone (1.064 g, 0.008 mol) and triethylamine (0.89 g, 0.0088 mol) in dry THF (15 mL) at room temperature under nitrogen, was slowly added 3,5-dinitrobenzoyl chloride (1.84 g, 0.008 mol) in dry THF (20 mL). The mixture was stirred at room temperature for 10 minutes, and the reaction was done indicating by TLC. The triethylamine hydrochloride was collected, and washed with acidic water and hot water. The resulting filtrate that contains the dinitro-product was rotating evaporated to yield the yellow solids (yield: 84.3%). The hydrogenation of above product in THF with 5% of platinum oxide as a catalyst, yielding the title product in brown color (yield: 52%).

Example 4

Copolymerization of BCBO-methacrylamide Monomer with Methyl Methacrylate

To a solution of monomer I-8 (0.201 g, 0.001 mol) in anhydrous THF (6 mL), were added methyl methacrylate (1.9 g, 0.019 mol) and AIBN (0.0023 g, 0.00015 mol). After the solution was purged with nitrogen, the reaction vessel was sealed. The very viscous solution was formed after stirring at 60° C. overnight. The white polymer was then precipitated in methanol. IR: 1763 $cm^{-1}$ (BCBO ketone).

Example 5

Terpolymerization of BCBO-methacrylamide Monomer with Butyl Methacrylate, and 2-Hydroxyl-ethyl Methacrylate (Feed ratio: 5 mol % BCBO, 15 mol % OH)

To a solution of monomer I-8 (0.1005 g, 0.0005 mol) in anhydrous THF (5 mL), were added methyl methacrylate (1.1362 g, 0.008 mol) and 2-hydroxylethyl methacrylate (0.195 g, 0.0015 mol) and AIBN (0.0023 g, 0.00015 mol). After the solution was purged with nitrogen, the reaction vessel was sealed. The very viscous solution was formed after stirring at 60° C. overnight. The white polymer was then precipitated in methanol. IR: 3434 $cm^{-1}$ (OH), 1760 $cm^{-1}$ (BCBO ketone).

Example 6

Preparation of BCBO-containing Polyoctadecene and Polyethylene

The title polymer was readily obtained from the conversion of 1 g of polyoctadecene-alt-maleic anhydride (from Aldrich Chemical. Co., contains 50% of maleic anhydride, and is treated at 200° C. for 30 min prior to use) upon imidization with 5-aminobenzocycobutenone (0.665 g, 0.005 mol) in xylene at 140° C. for 3 hours. The yellow polymer was precipitated from hexane. IR: 1762 $cm^{-1}$ (BCBO ketone, imide), 1720 $cm^{-1}$ (imide). A similar reaction was done using maleic anhydride-grafted polyethylene, from DuPont Canada as Fusabond™, and the both BCBO polymers were low melting and could be mold into a film and then crosslinked upon UV irradiation.

Example 7

Preparation of Polyacrylate Containing BCBO and Hydroxy Groups

To a solution of I-3 monomer (0.0935 g, 0.0005 mol) in ethyl acetate (5 mL), were added 2-ethylhexyl acrylate (1.5894 g, 0.0086 mol), 2-hydroxy ethyl acrylate (0.0697 g, 0.0006 mol), acrylic acid (0.0216 g, 0.0003 mol), and AIBN (0.009 g, 0.00006 mol). After the solution was purged with nitrogen, the reaction vessel was sealed. The very viscous solution was formed after stirring at 60° C. overnight. The resulting yellow solution was very sticky. The polymer was coated on a glass or polyester substrate, showing IR bands at 3434 $cm^{-1}$ (OH) and 1760 $cm^{-1}$ (BCBO ketone), and then directly exposed to UV light at 300–350 nm with an intensity of 1000 mw/$cm^2$ for one minute. The cured film showed no more peak at 1760 $cm^{-1}$ (BCBO ketone). The shear modulus of cured sample clearly increased, compared to the initial polymer.

Example 8

Preparation of Polyimide Containing BCBO and Hydroxy Group

The precursor polyimide containing pendent COOH unit was prepared from 6FDA and DABA (diamino benzoic acid) in m-cresol at 200° C. overnight, catalyzed by isoquinoline. To a solution of above COOH-containing polyimde (0.3 g) in anhydrous DMF, were added dicyclocarbodiimide (0.114 g, 0.0006 mol) and 5-aminobenzocyclobutenone (0.0575 g, 0.0004 mol). The reaction mixture was stirred at room temperature under Argon overnight. To the resulting solution, was added 4-amino benzylethanol (0.0822 g, 0.0006 mol). Then the mixture was stirred at room temperature under Argon another overnight. The title polyimide in beige color was precipitated from methanol. IR (KBr, $cm^{-1}$): 1778, 1723; Thermal ring-opening temperature: 280–300° C.

Example 9

Coupling Reaction of Benzocyclobutenone with Alcohols

The photochemical reaction of BCBO with several alcohols was first carried out as a model reaction. Both BCBO and alcohols at different ratios (0.5:1. 1:1. up to 1:3) were placed in a sealed UV cell (either in solution or in neat condition), and subsequently UV irradiated at ambient temperature. The UV source is the Novacure spot curing system produced by EFOS with a wavelength range of 300–350 nm and a light intensity of 1000 mw/cm$^2$. The reaction was monitored by gas chromatography (GC).

irradiation at 320 to 350 nm (light intensity of 500 mw/cm$^2$) for 1 min at ambient temperature. An excess of PEG-OH on the surface was washed away with methanol. ATR-IR (intensity of peak at 1762 cm$^{-1}$ decreased, and that of peak at 1721 cm$^{-1}$ increased) and XPS (286.4 eV due to $\underline{C}$—O from PEG-OH, 289.2 eV due to $\underline{C}$=O from ester formed) confirmed the formation of PEG units on PE surface.

| Alcohol | Solvent | Reaction Time (min) | GC Yield (%) | $10^{-4}$ $k_{exp}$ ($S^{-1}$) |
|---|---|---|---|---|
| n-butanol | — | 210 | 100 | 3.37 |
| benzoyl alcohol | — | 210 | 99 | 3.82 |
| 2-octanol | — | 150 | 98 | 4.65 |
| 1-octanol | — | 150 | 100 | 5.53 |
| 1-octanol | DMF (½ dilute) | 90 | 100 | 5.57 |
| 1-octanol | ethyl ether (½ dilute) | 90 | 98 | 7.72 |
| 1-octanol | cyclohexane (½ dilute) | 70 | 99 | 12.25 |

Example 10

Solid state UV Curing of Monomers I-1 and I-2 in Example 1

A film was cast from a chloroform solution of a mixture of I-1 and I-2 and then UV irradiated (300–350 nm, light intensity of 500 mw/cm$^2$) for one minute. The curing reaction was monitored by IR by the disappearance of the peak at 1750 cm$^{-1}$ due to BCBO ketone. The resulting film was peeled off and found to be insoluble in chloroform.

Example 11

Photo-grafting of BCBO-containing Polymer with Poly(ethylene glycol) Methyl Ether A mixture of BCBO-polystyrene containing 4 mol % of BCBO (0.15 g) and CH$_3$(OCH$_2$CH$_2$)$_n$OH (PEG-OH from Aldrich Chemicals, Mw=550, 1 g) in chloroform was placed in an UV cell, and subsequently UV irradiated at 300–350 nm (light intensity of 500 mw/cm$^2$) for 30 minutes. The reaction mixture was then poured into water or methanol. The resulting solution was centrifuged, filtered and extracted overnight with water or methanol in a Soxhlet extractor, to yield slightly yellow PEG-containing polystyrene. FT-IR and NMR proved the formation of PEG units through the reaction of BCBO with PEG-OH. IR: 1730 cm$^{-1}$ (ester), 1109 cm$^{-1}$ (ether).

Example 12

Surface Modification on Polyethylene

The BCBO-polyoctadecene prepared in Example 6 was first coated on commercial 0.2 mm thick polyethylene (PE) film, followed by coating with PEG-OH (Mw=550) and UV Example 13

Dye-stain Test of the Surface Modified PE

Since the PEG-grafted PE films have a hydrophilic surface, the dye-stain test was performed on the PEG-grafted PE surface. The hydrophilic PEG was coated on BCBO-PE surface, and then UV irradiated at 320–350 nm through a photomask (light intensity of 500 mw/cm$^2$). After the excess of PEG was washed away with water and methanol, the PE film surface was sprayed with a 0.5 wt % aqueous solution of 3,3'-diethylthiadicarbocyanine iodide. It could be clearly seen that only the area that was UV irradiated and hence grafted with PEG on the film is colored in blue distinctly, implying the location of photo grafting.

Example 14

Gel Formation from Self-curable Polyimide

The chloroform solution of the polyimide prepared in Example 8 was placed into an UV cell, then UV irradiated (320–350 nm, light intensity of 500 mw/cm$^2$) without a photoinitiator or a catalyst at ambient temperatures for a few minutes and the transparent gel was readily formed.

Example 15

Gel Formation from BCBO-polyoctadecene

The chloroform solution of this polyoctadecene prepared in Example 6 was placed into an UV cell, then UV irradiated (320–350 nm, light intensity of 500 mw/cm$^2$) without a photoinitiator or a catalyst at ambient temperatures for a few minutes and the transparent gel was readily formed.

Example 16

Pattern Formation on Substrate Using Self-curable Polyimide

The 140 nm-thick polyimide film was obtained by spin-coated on a silicon wafer substrate from 1 wt % tetrachloroethane solution. After UV curing (320–350 nm, light intensity of 500 mw/cm$^2$) through a contacted photomask, the polyimde in the UV irradiation area was crosslinked and thus insoluble. Whereas, the polyimde in the non-UV irradiation area could be washed away with chloroform. The pattern is already visible. For further investigation scanning electron microscopy (SEM) photograph was taken after a 10 nm film of gold was vacuum deposited onto the pattern. The SEM picture shows the shapes of the polyimide materials as dark lines whereas the silicon wafer surface appears white. The pattern edge is well recognizable and, taking the rather simple patterning conditions into account, well developed.

Example 17

Preparation of BCBO-acid I-4 from 5-Aminobenzocyclobutenone

To a solution of succinic anhydride (0.618 g, 0.0063 mol) in dry diethyl ether (15 mL) was added the 5-aminobenzocyclobutenone (0.798 g, 0.006 mol) in one portion at room temperature. The white solids were formed immediately. After stirred for 10–15 minutes, the resulting amic acid was collected by filtration and dried in air (yield 86%). IR (KBr, cm$^{-1}$) 1756.

Example 18

Preparation of N-benzocyclobutenone Acrylamide (I-3)

To a solution of 5-aminobenzocyclobutenone (2.556 g, 0.0192 mol) in anhydrous THF (10 mL) at room temperature under nitrogen, was added triethylamine (2.736 g, 0.0271 mol) in THF (5 mL). Then the temperature was cooled down to 0° C., acryloyl chloride (2.97 g, 0.0328 mol) in THF (10 mL) was added to the solution drop and drop. The resulting yellowish solution was allowed to warm up and stirred at room temperature overnight. The reaction solution was diluted with diethyl ether (50 mL for 0.23 g) and washed with diluted hydrochloric acid three times. Removal of the solvent and subsequent recrystallization of the residue ethanol/cyclohexane afforded the pure amide product as a beige crystalline solid (87% yield). IR (KBr, cm$^{-1}$) 3357, 2923, 1760, 1660; UV ($\lambda_{max}$, methanol) 320 nm.

Example 19

Photo Crosslinking of Polymer Using bis-BCBO in Solution

The Bis-BCBO compounds can react with polyols under UV irradiation to form crosslinked structure. Typically, the compound in formula II in which X is diaminobutane is dissolved in chloroform or tetrahydrofuran with polyols or polybutyral. Then the solution was UV irradiated at 300–350 nm. The IR spectra showed the disappearance of peak at 1760 cm$^{-1}$ due to BCBO ketone, and the appearance of a new peak at 1720 cm$^{-1}$ due to the newly formed ester bond. The UV irradiation on the concentrated solution (20%) caused the formation of gel.

Example 20

Photo Crosslinking of Polymer Using bis-BCBO in the Solid State

The solid film was cast from the aforementioned solution as described in Example 19 or made by mixing polymer and bis-BCBO powder and then melt compression (the chosen temperature should not be higher than the ring-opening temperature of this compound, hence the low melting point bis-BCBO is preferred). The solid film was UV irradiated, and was not soluble in aforementioned solvent any more.

Example 21

Preparation of BCBO-containing Nylon 66

The BCBO-containing nylon 66 (0.5 mol % feed ratio of BCBO) was made as follows: To a 100 mL three-necked flask, were added hexamthylenediamine (0.915 g, 0.005 mol), diamino-BCBO I-6 as illustrated in Example 3 (0.133 g, 0.0005 mol) and triethylamine (0.7575 g, 0.0075 mol) in 10 mL of N,N-dimethylacetamide (DMAc, 10 mL). To this stirring solution at room temperature under nitrogen, was added rapidly adipoyl chloride (0.522 g, 0.0045 mol) in 5 mL of DMAc. The reaction mixture was stirred for a few hours, then precipitated in hexane. The resulting solids were washed with diluted acidic water to afford brown power. IR (KBr, cm$^{-1}$) 3303, 2934, 1762, 1637. The presence of BCBO in nylon 66 was also confirmed by differential scanning calorimetry. The first DSC trace of BCBO-nylon 66 displayed an exothermic peak at about 220° C.

Example 22

UV Cure of BCBO-containing Nylon 66

To modify nylon 66 having the BCBO moiety, commercial poly(4-hydrostyrene) was used. BCBO-containing nylon 66 and poly(4-hydrostyrene) were mixed and grounded. The samples were hydraulically pressed into a film and then UV irradiated at 300–320 nm. The curing process was monitored by IR. After UV cure, the excess of poly(4-hydrostyrene) was washed away using acetone. The IR spectrum of BCBO-nylon 66 showed a peak at 1762 cm$^{-1}$ due to the BCBO's ketone group. With the increment of UV curing time, this peak decreased gradually then nearly disappeared. The BCBO ring opening was also confirmed by differential scanning calorimetry (DSC) studies. The first DSC trace of BCBO-nylon 66 displayed an exothermic peak. Nevertheless, no such peak was found in the first run of cured nylon samples. Thermal analysis showed that the cured nylons had similar melting points as those of linear polymers. However, TGA curves displayed a significantly change of heat resistance for cured nylons.

Example 23

General Procedure for Making BCBO-containing Vinyl Polymers

The copolymerization and terpolymerization of BCBO monomers I-3 or I-8 with vinyl monomers were carried out in vacuum at 60° C., using AIBN as an initiator. The monomer concentrations were 2 mol/L approximately and solvent was dry THF. The solution was stirred at 60° C. for about 24 hours. The reaction mixture was successively precipitated into hexane or methanol until no more monomers left and finally dried under vacuum. Specific procedures are in Example 4, Example 5 and Example 7.

Characterizations of selected BCBO-containing copolymers and terpolymers (5 mol % of BCBO) are listed in Table 1.

| Polymer Structure[a] | Mw | PDI | $T_g$ (°C.)[b] | $T_R$ (°C.)[c] | $T_d$ (°C.)[d] |
|---|---|---|---|---|---|
| BCBO-St | 40600 | 1.8 | 108 | 300 | 375 |
| BCBO-MMA | 78000 | 1.9 | 112 | —[e] | — |
| BCBO-HEMA-MMA | 84000 | 1.8 | 121 | $T_R > T_d$ | 246 |
| BCBO-HEMA-BuMA | 91000 | 2.3 | 55 | $T_R > T_d$ | 250 |
| BCBO-HEMA-St | 56000 | 1.6 | 91 | 190 | 350 |
| BCBO-HEMA-An | 64000 | 2.1 | 90 | 200 | 270 |
| BCBO-HEMA-AA | 62000 | 2.2 | — | — | — |

[a]BCBO - BCBO methacrylate; St - styrene; MMA - methyl methacrylate; HEMA - 2-hydroxyl ethyl methacrylate; BuMA - n-butyl methacrylate; An - acrylonitrile; AA - acrylic acid.
[b]Measured by DSC at 10° C./min, under a nitrogen flow of 50 mL/min, 1st scan.
[c]Temperature at maximum of exothermic peak.
[d]Measured by TG at 5% weight loss, with a heating rate of 10° C./min, under a nitrogen flow of 200 mL/min.
[e]not/applicable

OTHER PATENTS

1. Z. Y. Wang, "Benzocyclobutenones and Polymers Derived Therefrom", U.S. Pat. No. 5,869,693 (Feb. 9, 1999).
2. Z. Y. Wang, "Benzocyclobutenones and Polymers Derived Therefrom", Canadian Patent Application 2,195,346 (filed on Dec. 20, 1996).

OTHER PUBLICATIONS

1. Trout, T. T.; Schmieg, J, J.; Gambogi, W. J.; Weber, A. M. *Adv. Mater.* 1998, 10, 1219.
2. Wong, C. P., Ed. *Polymers for Electronic and Photonic Applications*, Academic press, London, 1993.
3. (a) Reiser, A., Ed. *Photoreactive Polymers: The Science and Technology of Resists*, John Wiley & Sons, New York, 1989. (b) Allen, N. S., Ed. *Photopolymerization and Photoimaging Science and Technology*, Elservier, London, 1989, Chapter 3.
4. (a) Reichmanis, E.; Nalamasu, O.; Houlihan, F. M.; Novembre, A. E. *Polym. Int.* 1999, 48, 1053. (b) Nonogak, S.; Ueto, T.; Ito, T. Eds. *Microlithography Fundamentals in Semiconductor Devices and Fabrication Technology*, Marcel Dekker, New York, 1998. (c) Reichmanis, E.; MacDonald, S. A.; Iwayanagi, T. Eds. *Polymers in Microlithography: Materials and Processes*, ACS Symposium Series No. 412, American Chemical Society, Washington, D.C., 1989.
5. (a) Schilling, M. L.; Colvin, V. L.; Dhar, L.; Harris, A. L.; Schilling, F. C.; Katz, H. E.; Wysock, T.; Hale, A.; Blyler, L. L.; Boyd, C. *Chem. Mater.* 1999, 11, 247. (b) Lessard, R. A.; Manivannan, G. Eds. *Selected Papers on Photopolymers: Physics, Chemistry, and applications*, SPIE Optical Engineering Press, Bellingham, Wash., 1995.
6. Bühler, N.; Belluš, D. *Pure & Appl. Chem.* 1995, 67, 25.
7. (a) Schiess, P.; Heitzmann, M. *Angew. Chem. Int. Ed. Engl.* 1977, 16, 469. (b) Spangler, J.; Kim, J. H. *Tetrahedron Lett.* 1972, 1249. (c) Liebeskind, L. S.; South, M. S. *J. Org. Chem.*, 1982, 47, 3815. (d) Suzzarini, L.; Lin, J.; Wang, Z. Y. *Tetrahedron Lett.* 1998, 39, 1695.
8. (a) Jenny, E. F.; Roberts, J. D. *J. Am. Chem. Soc.* 1956, 78, 2005. (b) Niwayama, S.: Kallel, E. A.; Sheu, C.; Houk, K. N. *J. Org. Chem.* 1996, 2517.
9. Baldwin, J. E.; McDaniel, M. C. *J. Am. Chem. Soc.* 1968, 90, 6118.
10. Bally, T.; Michalak, J. *J. Photochem. Photobiol. A: Chem.* 1992, 69, 185.
11. Schiess, P.; Eberle, M.; Huys-Francotte, M.; Wirz, J. *Tetrahedron Lett.* 1984, 25, 2201.
12. (a) Tomioka, H.; Yamamoto, K. *J. Chem. Soc. Chem. Commun*, 1995, 1961. (b) Wang, Z. Y.; Kuang, L.; Meng, X. S.; Gao, J. P. *Macromolecules* 1998, 31, 5556.
13. Wang, Z. Y.; Suzzarini, L.; Gao, J. P. *Tetrahedron Lett.* 1997, 38, 5745.

We claim:
1. A BCBO-containing polymer of structural formula (VII), (VIII),[m] (IX) or (X):

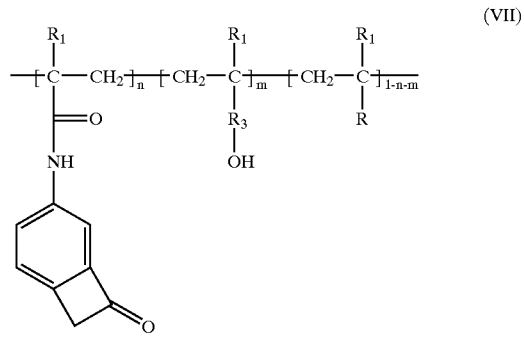

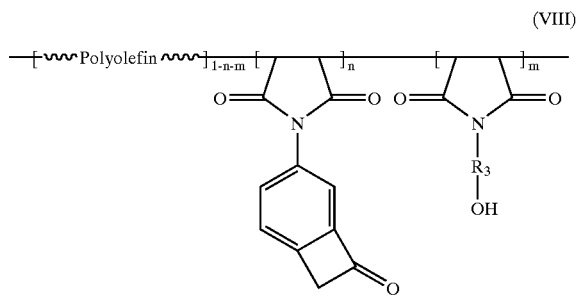

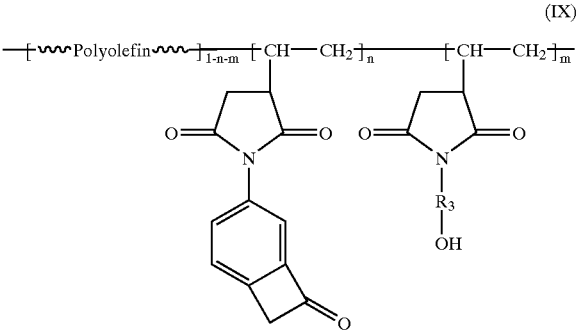

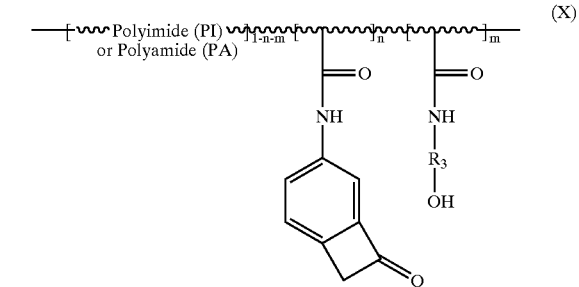

wherein R is alkyl, aryl, haloalkyl, hydroxyalkyl, —CN, —CONH$_2$, —Si(OCH$_3$)$_3$,

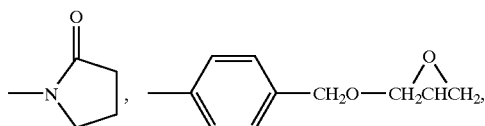

or —COOR₂, where R₂ is H, alkyl or haloalkyl, hydroxyalkyl, cyanoalkyl, epoxyalkyl, alkoxy, ether, ester, acetate; $R_1$ is H or methyl group; $R_3$ is alkylene, arylene, or an ester moiety; n and m are each numbers of 0.1 to 0.9 and [∿∿∿∿∿∿∿] represents a polymer backbone for pendant groups.

2. A BCBO-containing polymer of claim 1, of said structural formula (VII).

3. A BCBO-containing polymer of claim 1, of said structural formula (VIII).

4. A BCBO-containing polymer of claim 1, of said structural formula (IX).

5. A BCBO-containing polymer of claim 1, of said structural formula (X).

6. A self-curable polymer comprising a polymer of structural formula (III), (IV), (V), (VI), (VII), (VIII), (IX) or (X):

(III)

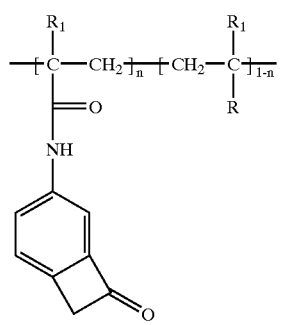

(IV)

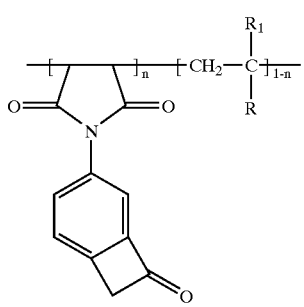

(V)

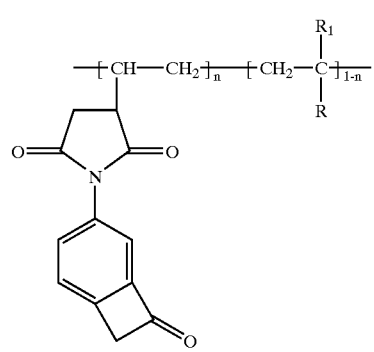

(VI)

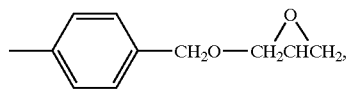

wherein R is alkyl, aryl, haloalkyl, hydroxyalkyl, —CN, —CONH₂, —Si(OCH₃)₃,

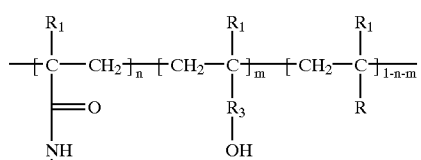

or 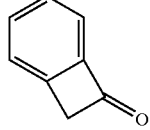 —COOR₂, where R₂ is H, alkyl or haloalkyl, hydroxyalkyl, cyanoalkyl, epoxyalkyl, alkoxy, ether, ester or acetate; n and m are each numbers of 0.1 to 0.9; [∿∿∿∿∿∿∿] represents a polymer backbone for pendant groups; and $R_1$ is H or a methyl group, (VII)

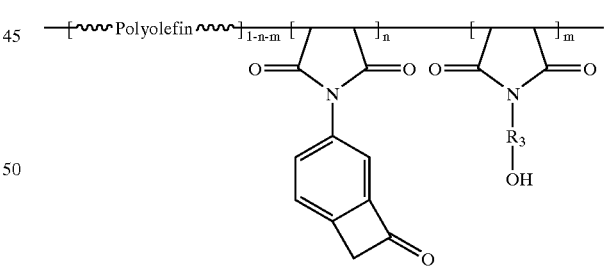

(VIII)

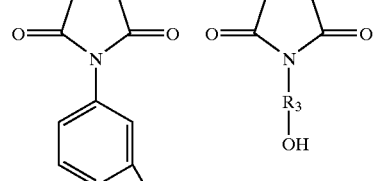

(IX)

-continued

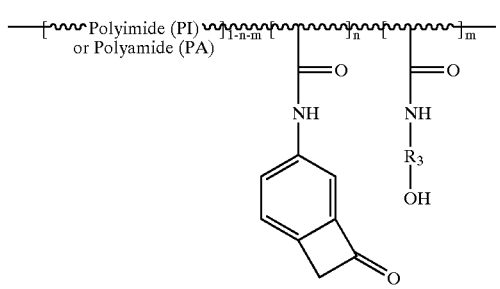

wherein R is alkyl, aryl, haloalkyl, hydroxyalkyl, —CN, —CONH₂, —Si(OCH₃)₃,

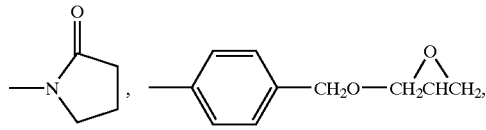

or —COOR₂, where R₂ is H, alkyl or haloalkyl, hydroxyalkyl, cyanoalkyl, epoxyalkyl, alkoxy, ether, ester, acetate; $R_1$ is H or methyl group; $R_3$ is alkylene, arylene, or an ester moiety; n and m are each numbers of 0.1 to 0.9; and [∼∼∼∼] represents a polymer backbone for pendant groups;

as a photoresist material active in the UV wavelength of 220–500 nm.

7. A BCBO-containing polymer of structural formula (VI):

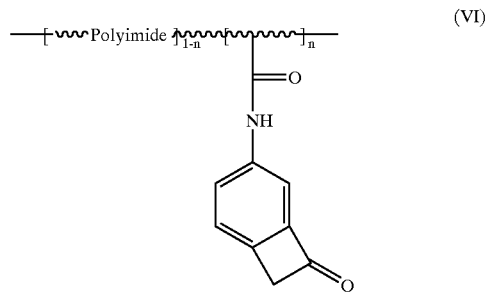

wherein n is an numbers from 0.1 to 0.9; and [∼∼∼∼] represents a polymer backbone for pendant BCBO groups.

* * * * *